United States Patent [19]

Matero

[11] Patent Number: 5,787,362
[45] Date of Patent: Jul. 28, 1998

[54] AM REMOVAL FROM FM SIGNAL GENERATED BY IQ MODULATOR

[75] Inventor: Jorma Matero, Oulu, Finland

[73] Assignee: Nokia Mobile Phones Limited, Salo, Finland

[21] Appl. No.: 677,724

[22] Filed: Jul. 8, 1996

[51] Int. Cl.⁶ .................................................. H04B 1/04
[52] U.S. Cl. .................... 455/553; 455/93; 455/110; 375/216
[58] Field of Search ........................ 455/552, 553, 455/114, 110, 116, 93, 127, 76; 375/216, 273, 278, 297

[56] References Cited

U.S. PATENT DOCUMENTS

| | | | |
|---|---|---|---|
| 4,955,039 | 9/1990 | Rother et al. | 375/75 |
| 5,008,925 | 4/1991 | Pireh | 379/60 |
| 5,020,076 | 5/1991 | Cahill et al. | 375/5 |
| 5,020,092 | 5/1991 | Phillips et al. | 379/59 |
| 5,079,520 | 1/1992 | Rapeli | 331/100 A |
| 5,124,672 | 6/1992 | Kuisma | 332/103 |
| 5,224,119 | 6/1993 | Barabash et al. | 375/59 |
| 5,291,474 | 3/1994 | Ikonen et al. | 370/30 |
| 5,301,367 | 4/1994 | Heinonen | 455/76 |
| 5,325,075 | 6/1994 | Rapeli | 332/103 |
| 5,390,168 | 2/1995 | Vimpari | 370/30 |
| 5,422,931 | 6/1995 | Austin-Lazarus et al. | 455/553 |
| 5,471,652 | 11/1995 | Hulkko | 455/76 |
| 5,590,402 | 12/1996 | Samson et al. | 455/553 |
| 5,642,378 | 6/1997 | Denheyer et al. | 375/216 |

FOREIGN PATENT DOCUMENTS

| | | |
|---|---|---|
| 0305603 A1 | 3/1989 | European Pat. Off. |
| 0541305 A1 | 5/1993 | European Pat. Off. |
| 0581573 A1 | 2/1994 | European Pat. Off. |
| 892081 | 11/1989 | Finland |
| WO 94/14247 | 6/1994 | WIPO |

*Primary Examiner*—Chi H. Pham
*Attorney, Agent, or Firm*—Perman & Green, LLP

[57] ABSTRACT

A circuit is provided for use in a dual mode mobile phone for selectively one of phase modulating or frequency modulating an RF signal. The circuit includes an IQ generator for generating one of first quadrature waveshapes or second quadrature waveshapes in response to a modulating signal; a quadrature mixer for mixing the first quadrature waveshapes or the second quadrature waveshapes with an RF signal to generate a phase modulated RF signal or a frequency modulated signal, respectively; and a limiter, such as at least one limiting amplifier, that has an input coupled to an output of the quadrature mixer for reducing an amplitude modulation component of only the frequency modulated signal. The at least one limiting amplifier has an input coupled to a limit control signal that has a magnitude selected for setting a dynamic range of the at least one limiting amplifier. The phase modulated signal may be a π/4-DQPSK signal. This invention also teaches an analog mobile phone that employs the IQ modulator and limiter to generate a FM transmission signal, and that furthermore requires but a single variable local oscillator that is used to quadrature mix and up-convert the transmitted FM signal, and that is also used to down-convert a received FM signal to an IF signal. The IF signal has a frequency equal to the channel spacing between the transmitted and received FM signals, or 45 MHz in an analog mobile phone embodiment compatible with IS-91.

16 Claims, 2 Drawing Sheets

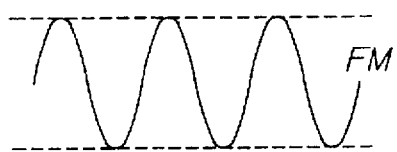
Fig. 3A
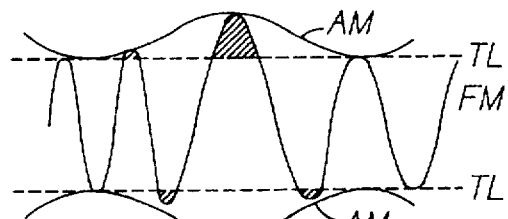
Fig. 3B
Fig. 4
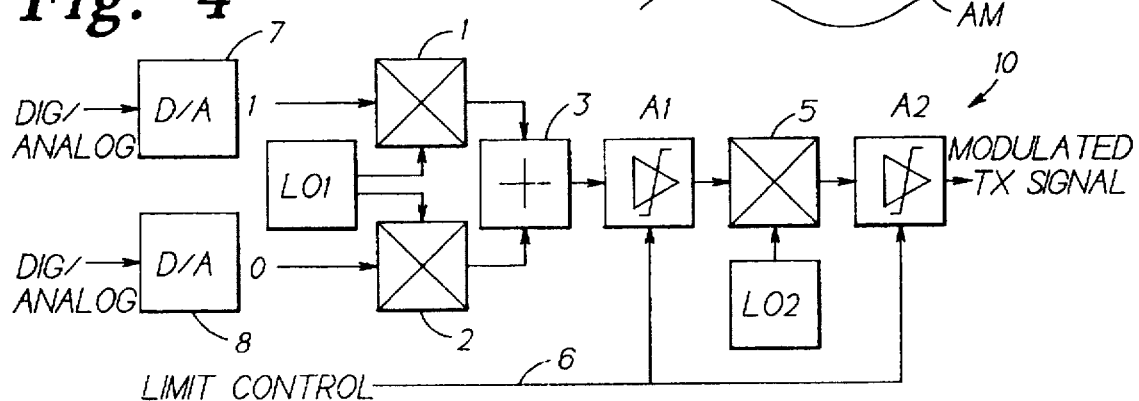
Fig. 5
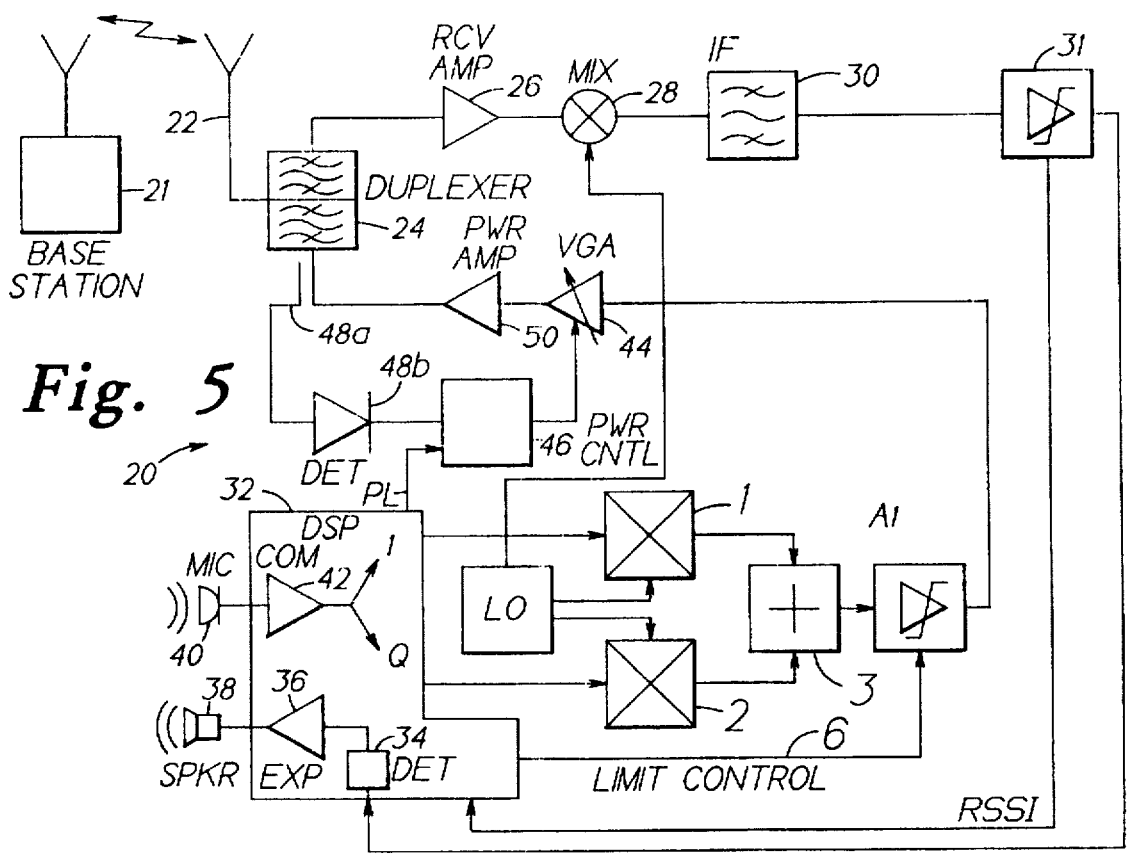

AM REMOVAL FROM FM SIGNAL GENERATED BY IQ MODULATOR

FIELD OF THE INVENTION:

This invention relates generally to RF circuits and, in particular, to RF circuits used for generating a transmitted signal in a radio telephone, such as a cellular telephone or mobile phone.

BACKGROUND OF THE INVENTION:

In a dual mode mobile phone (i.e., a mobile phone operable with two different types of air interface standards) there is a requirement to generate two different types of RF signal modulation. In one type of dual mode system deployed in the United States the required modulation types are π/4-DQPSK (for digital TDMA) and FM (for analog, i.e., AMPS). In another type of dual mode system (CDMA/FM) the digital CDMA portion employs quadrature phase shift keying (QPSK). One conventional method to generate the FM is to modulate a transmitter local oscillator (LO) signal, while the π/4-DQPSK modulation is generated by an In-phase/Quadrature (IQ) modulator. FIG. 1A illustrates a typical arrangement for such a dual mode modulator. Reference can also be had to U.S. Pat. No.: 5,020,076, issued May 28, 1991, entitled "Hybrid Modulation Apparatus", to S.V. Cahill et al. An improved technique is disclosed in commonly assigned U.S. Pat. No. 5,392,460, issued Feb. 21, 1995, entitled "Dual Mode Radiotelephone Terminal Selectively Operable for Frequency Modulated or Phase Modulated Operation", by Heikki Mattila, Jorma Matero (the inventor of the subject matter of this patent application), and Jaakko Hulkko.

In FIG. 1A, and when operating in the digital mode, IQ signals derived from digital to analog (D/A) converters (not shown) are applied to quadrature mixers 1 and 2, which also have inputs connected to a first local oscillator (LO1). LO1 provides two frequency outputs that are offset from one another by 90°. The outputs from quadrature mixers 1 and 2 are combined at block 3, amplified at block 4, up-converted to the transmit frequency with mixer 5 and a second local oscillator (LO2), and then amplified again at block 6 to form a π/4-DQPSK modulated transmit (TX) signal. When operating in the analog mode the mixers 1 and 2 are DC biased to allow carrier feedthrough, the output of LO1 is frequency modulated in accordance with a signal to be transmitted (e.g., a speech signal), and the resulting output modulated TX signal is then a frequency modulated signal.

As is shown in FIG. 1B, it is also known in the art to generate FM directly with an IQ modulator, as is evidenced by commonly assigned U.S. Pat. No.: 5,124,672, issued Jun. 23, 1992, entitled "Combined Analog/Digital Frequency Modulator", by Erkki J. Kuisma. Briefly, the analog mode IQ signals ($I_A$ and $Q_A$) are formed to be the time derivative $dx/dt$ of a signal $x(t)$ in accordance with:

$$I_A = \sin(kx(t)), \text{ and}$$

$$Q_A = \cos(kx(t)).$$

The resulting signal U is modulated to the transmission frequency according to:

$$U = \sin(\omega_c t + kx(t)).$$

In this approach the IQ signals can be generated by separate, analog mode D/A converters. To generate an ideal FM signal with little or no amplitude modulation (AM) component, as shown in FIG. 3A, the sample rate of the I and Q D/A converters should be high. However, the required D/A sampling rate is much higher than is required to generate π/4-DQPSK modulation when operating in the digital mode. As a result, if a single set of D/A converters is desired to generate both the analog mode and the digital mode IQ signals, and if the single set of D/A converters is specified based on the less stringent requirements imposed by the digital mode operation, there exists a possibility that, when operating in the analog mode, the FM signal will have a non-negligible AM envelope component associated with it, as is shown in FIG. 3B. The presence of the AM component can result in the generation of an undesirable audible signal when the FM signal is subsequently received and detected.

It is known in the art of FM receivers that AM can be removed from an FM signal by a limiting amplifier. FIG. 2A illustrates a conventional limiting amplifier (LA) in which both positive and negative peaks of the output waveform are clipped. The signal envelope clipped due to the compression of the Stage 2 amplifier. The degree of limiting depends on the input signal level and the gain of the amplifier stages. The output signal level is defined by the compression point of the Stage 2 amplifier.

OBJECTS OF THE INVENTION:

It is a first object of this invention to provide an improved dual mode IQ modulator circuit that overcomes the foregoing and other problems.

It is another object of this invention to provide a dual mode IQ modulator that enables the use of lower cost, lower power consumption D/A converters for generating both the analog mode and digital mode IQ signals.

It is a further object of this invention to provide a dual mode IQ modulator that provides for the removal of all or most of an AM component of the FM transmission signal.

It is one further object of this invention to provide a single mode FM radio telephone of simplified construction that employs an IQ modulator to generate the FM transmission signal, and that avoids the generation of an undesirable AM component.

SUMMARY OF THE INVENTION

The foregoing and other problems are overcome and the objects of the invention are realized by methods and apparatus in accordance with embodiments of this invention. As described herein, a circuit is provided for use in a dual mode mobile phone for selectively one of phase modulating or frequency modulating an RF signal. The circuit includes an IQ generator for generating one of first quadrature waveshapes or second quadrature waveshapes in response to a modulating signal; a quadrature mixer for mixing the first quadrature waveshapes or the second quadrature waveshapes with an RF signal to generate a phase modulated RF signal or a frequency modulated signal, respectively; and a limiter, such as at least one limiting amplifier, that has an input coupled to an output of the quadrature mixer for reducing an amplitude modulation component of only the frequency modulated signal. The at least one limiting amplifier has an input coupled to a limit control signal that has a magnitude selected for setting a dynamic range of the at least one limiting amplifier. In a presently preferred, but not limiting, embodiment of this invention the phase modulated signal is a π/4-DQPSK signal.

Also described is an analog mobile phone that employs the IQ modulator and limited of this invention to generate a FM transmission signal, and that furthermore employs but a single variable local oscillator that is used to quadrature mix and up-convert the transmitted FM signal, and that is also used to down-convert a received FM signal to an IF signal. The IF signal has a frequency equal to the channel spacing between the transmitted and received FM signals, or 45 MHz in an analog mobile phone compatible with IS-91.

BRIEF DESCRIPTION OF THE DRAWINGS

The above set forth and other features of the invention are made more apparent in the ensuing Detailed Description of the Invention when read in conjunction with the attached Drawings, wherein:

FIG. 3A illustrates an ideal FM signal having no AM component;

FIG. 3B illustrates an FM signal which has an AM component;

FIG. 4 illustrates a block diagram of a dual mode modulator in accordance with this invention, wherein limit control circuitry is used to remove an AM component from a FM signal that is generated with the dual mode IQ modulator technique of FIG. 1B; and FIG. 5 is a simplified block diagram of an analog-only mobile phone that is constructed in accordance with the teachings of this invention.

DETAILED DESCRIPTION OF THE INVENTION

The disclosure of the above-referenced commonly assigned U.S. Pat. No. 5,124,672, issued Jun. 23, 1992, entitled "Combined Analog/Digital Frequency Modulator", by Erkki J. Kuisma, is incorporated by reference herein in its entirety for teaching apparatus for selectively generating one of a FM signal or a π/4-DQPSK signal with an IQ modulator.

Figure 1A:
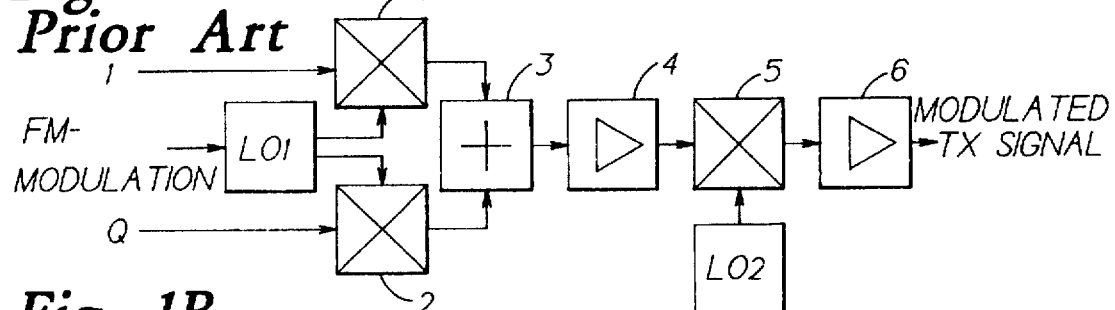
FIG. 1A is a block diagram of a conventional dual mode modulator wherein a local oscillator signal is frequency modulated when operating in the analog mode.
Figure 1B:
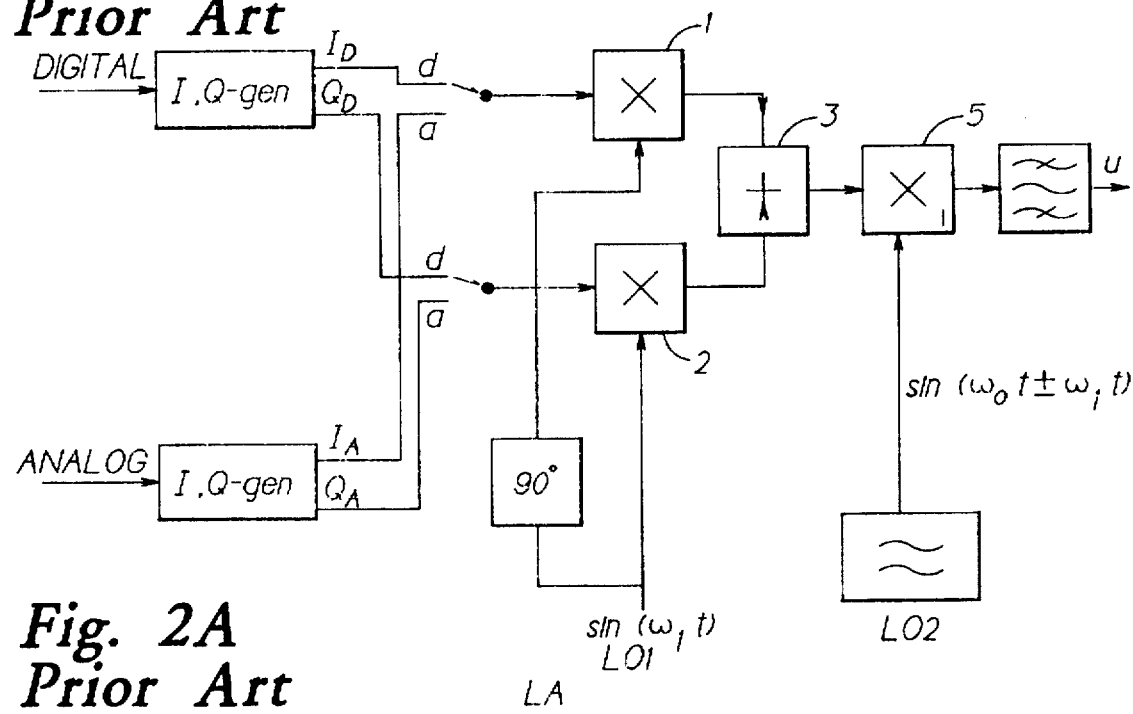
FIG. 1B is a block diagram of a conventional dual mode modulator wherein an IQ modulator is used for both phase and frequency modulation.

Reference is now made to FIG. 4 for illustrating the use of the Kuisma dual mode IQ modulator in accordance with this invention. Components of the IQ modulator that function as in FIGS. 1A and 1B are numbered the same. It should be noticed that the amplifiers 4 and 6 of FIG. 1A are replaced by first and second limiting amplifiers A1 and A2, respectively, and that no frequency modulation input is required at the input of LO1. The limiting amplifiers A1 and A2 are connected to a Limit Control signal 6. In addition, I and Q D/A converters 7 and 8, which are used in both the analog and digital modes of operation, are also shown in FIG. 4.

Figure 2A:
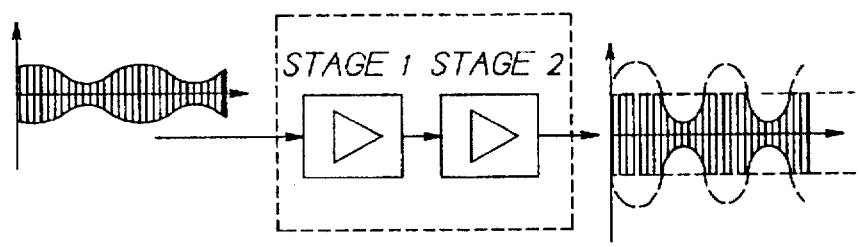
FIG. 2A illustrates a conventional limiting amplifier, and its associated waveforms.
Figure 2B:
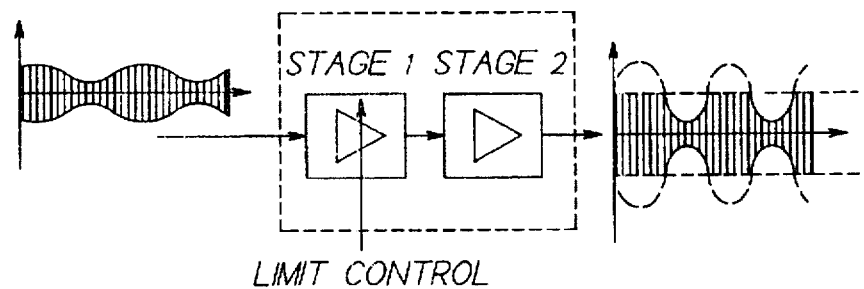
FIG. 2B illustrates a limiting amplifier which has a control signal (Limit Control) for defining compression and a degree of limiting, wherein it is possible to reduce the signal level to avoid clipping.

In the combined FM and π/4-DQPSK IQ modulator 10 of FIG. 4 the π/4-DQPSK modulation is generated as described by Kuisma. In this mode of operation the limiting amplifiers A1 and A2 are operated in the linear mode since the π/4-DQPSK signal by definition does not have a constant envelope. That is, and referring also to FIG. 2B, the gain of Stage 1 is controlled with the Limit Control signal so as to avoid clipping in the Stage 2 amplifier. As was noted above, the IQ input signals are generated by the respective I and Q D/A converters 7 and 8. It is assumed that the signal that is to be transmitted, such as speech or signalling information, is first converted to a digital form before being applied to the D/A converters 7 and 8.

It is within the scope of this invention to construct the limiting amplifier without the Limit Control signal 6. In this case the linear operation of the limiting amplifier during π/4-DQPSK modulation is made possible if the amplitude of the I and Q modulating signals is reduced. However, the use of this technique may experience a reduced signal to noise ratio at the output of the I and Q D/A converters.

In the analog mode, that is, when FM modulation is generated by the IQ signals in accordance with the teachings of U.S. Pat. No. 5,124,6721, the limiting amplifiers A1 and A2 are set into the limiting mode by the Limit Control signal 6. In this case the Stage 1 gain of the amplifier pair A1 and A2 is set at a sufficient level so that the Stage 2 output is clipped, thereby reducing or eliminating the AM content of the FM signal and improving the quality of the FM signal.

In the preferred embodiment of this invention both the amplifier at the output of summation block 3 (i.e., A1) and the amplifier at the output of the up-conversion mixer 5 (i.e., A2) are limiting amplifiers. However, in other embodiments of this invention it may be possible to use but one limiting amplifier, such as A1.

The Limit Control signal may be simply switched on or off, depending on the mode of operation of the mobile phone. When switched on the Limit Control signal assumes a predetermined value that has been found to provide the required amount of AM component removal from the FM signal. However, it is also within the scope of this invention to provide the Limit Control signal 6 as a variable magnitude signal so as to controllably vary the dynamic range of A1 and A2.

The benefits made possible by the teaching of this invention are several. First, the IQ D/A converter sampling rate can be made lower (i.e., matched to the π/4-DQPSK digital mode requirement), thereby enabling the use of lower cost, lower power consumption components. Second, the operating code for a digital signal processor (DSP), and also baseband ASIC hardware, can be optimized, since the sampling rates in both operation modes (analog and digital) can be made to be equal or approximately equal. Third, the limiting amplifiers A1 and A2 are readily implemented in a modulator integrated circuit. Fourth, the additional FM modulation line (that is input to LO1 in FIG. 1) and additional, separate DA converters for the FM modulator can be eliminated, thereby simplifying the construction and reducing the cost.

Reference is now made to FIG. 5 for illustrating the use of this invention in a single mode, analog FM mobile phone 20, such as one compatible with IS-91 (AMPS). The mobile phone 20 includes an antenna 22 connected to a duplexer 24. For a receive signal path, an output of the duplexer 24 is connected to an input of a receive amplifier 26. An output of the receive amplifier 26 is connected to a down-conversion mixer 28 that is driven by a local oscillator (a voltage controlled oscillator or VCO) such that tuning between channels can be accomplished. The signals received from a base station 21 in the IS-91 system may vary between, by example 869.040 MHz to 893.970 MHz. The output of the mixer 28 is fed to an IF bandpass filter 30 (e.g., 45 MHz). The output of IF filter 30 is an IF signal that is input to a limiting amplifier 31, which also provides a received signal strength indicator signal (RSSI). The output of the limiting amplifier 31 is input to a digital signal processor (DSP) block 32, wherein an FM detector function 34 extracts the speech and/or signalling information from the IF signal. The DSP 32 includes an expander 36 and suitable conventional audio circuits for driving an earphone or speaker 38.

In a transmit path, the mobile phone 20 includes a microphone 40 having an output connected to a compressor 42 and suitable audio processing circuitry, including the D/A converters for generating the IQ signals. The IQ signals are applied to the IQ modulator comprising the quadrature mixers 1 and 2, driven by the variable LO, and the summation block 3. The mobile phone 20 also includes at least one limiting amplifier (A1) which operates as described above to reduce or eliminate the AM component of the FM signal output from the summation block 3. The limit control signal 6 can be provided if it is desired to controllably adjust the dynamic range of A1 during operation, as was described above. Otherwise, the limit control input of A1 can be connected to a predetermined potential for setting a predetermined dynamic range for A1. The output of A1 is coupled to an input of a variable gain amplifier (VGA) 44 that is controlled by a gain control signal generated by a power control block 46 having inputs from a power detector circuit 48a and 48b and a power level (PL) signal output from the DSP 32. The output of the VGA 44 is coupled to a power amplifier 50 having an output connected, via duplexer 24, to the antenna 22. The signals transmitted by the mobile phone 20 in the IS-91 system may vary between, by example 824.040 MHz to 848.970 MHz. A 45 MHz duplex channel separation exists between respective transmit and receive channels.

One feature of the mobile phone 20 is the use of the single UHF variable local oscillator (LO) to provide both the down-conversion and up-conversion functions, thereby eliminating at least one phase locked loop and voltage controlled oscillator that are found in conventional FM analog mobile phones. That is, the local oscillator (LO) is used to up-convert the FM transmission signal in quadrature mixers 1 and 2 to the transmission frequency, while providing down-conversion mixing of the received FM signal in mixer 28. The value of the IF is established at 45 MHz, the frequency between the transmitted and received channels.

Another important feature of the mobile phone 20 is an ability to take advantage of relatively lower sampling rate, lower cost D/A converters, in combination with the FM IQ modulator, and to then compensate for the use of the lower sampling rate D/A converters by removing the AM component from the resulting FM signal.

Although described above with respect to certain mobile phone types, it should be realized that the teaching of this invention also applies to such dual and higher mode phones as, by example, AMPS/DCS and AMPS/NAMPS/CDMA. Also, other phase modulation techniques, besides π/4-DQPSK modulation, can be accomplished using the disclosed circuitry.

Thus, while the invention has been particularly shown and described with respect to preferred embodiments thereof, it will be understood by those skilled in the art that changes in form and details may be made therein without departing from the scope and spirit of the invention.

What is claimed is:

1. A circuit for selectively one of phase modulating or frequency modulating an RF signal, comprising:

IQ generator means for generating one of first quadrature waveshapes or second quadrature waveshapes in response to a modulating signal;

quadrature mixer means for mixing the first quadrature waveshapes or the second quadrature waveshapes with a first RF signal to generate a phase modulated RF signal or a frequency modulated signal, respectively; and limiter means having an input coupled to an output of said quadrature mixer means for reducing an amplitude modulation component of only said frequency modulated signal.

2. A circuit as set forth in claim 1, wherein said limiter means is comprised of at least one limiting amplifier.

3. A circuit as set forth in claim 1, wherein said limiter means is comprised of a first limiting amplifier and a second limiting amplifier, and further comprising up-conversion mixer means interposed between said first and second limiting amplifiers, said up-conversion mixer means being coupled to a second RF signal.

4. A circuit as set forth in claim 2, wherein said at least one limiting amplifier has an input coupled to a limit control signal having a magnitude selected for setting a dynamic range of said at least one limiting amplifier.

5. A circuit as set forth in claim 1, wherein said phase modulated signal is a π/4-DQPSK signal.

6. A dual mode mobile phone comprising a circuit for selectively one of phase modulating or frequency modulating a transmitted RF signal, said circuit comprising:

IQ generator means for generating one of first quadrature waveshapes or second quadrature waveshapes in response to a modulating signal;

quadrature mixer means for mixing the first quadrature waveshapes or the second quadrature waveshapes with a first RF signal to generate a phase modulated RF signal or a frequency modulated signal, respectively; and limiter means having an input coupled to an output of said quadrature mixer means for reducing an amplitude modulation component of only said frequency modulated signal.

7. A circuit as set forth in claim 6, wherein said limiter means is comprised of at least one limiting amplifier.

8. A circuit as set forth in claim 6, wherein said limiter means is comprised of a first limiting amplifier and a second limiting amplifier, and further comprising up-conversion mixer means, interposed between said first and second limiting amplifiers and coupled to a second RF signal, for up-converting the output of said quadrature mixer means to a transmission frequency.

9. A circuit as set forth in claim 7, wherein said at least one limiting amplifier has an input coupled to a limit control signal having a magnitude selected for setting a dynamic range of said at least one limiting amplifier.

10. A circuit as set forth in claim 6, wherein said phase modulated signal is a π/4-DQPSK signal.

11. A mobile phone comprising a circuit for frequency modulating a transmitted RF signal, said circuit comprising:

IQ generator means for generating quadrature waveshapes in response to a modulating signal;

quadrature mixer means for mixing the quadrature waveshapes with a local oscillator signal to generate a frequency modulated RF transmission signal;

limiter means having an input coupled to an output of said quadrature mixer means for generating a limited frequency modulated RF transmission signal having a reduced amplitude modulation component;

said mobile phone further comprising, amplifier means having an input coupled to an output of said limiter means for amplifying said limited frequency modulated RF transmission signal prior to transmission of the signal from an antenna;

receiver means for receiving a frequency modulated signal from said antenna, said receiver means comprising a down-conversion mixer means having an input coupled to said local oscillator signal for generating an intermediate frequency modulated signal; and detector means coupled to said intermediate frequency modulated signal for extracting a desired signal therefrom.

12. A mobile phone as forth in claim 11, wherein said limiter means is comprised of at least one limiting amplifier.

13. A mobile phone as set forth in claim 12, wherein said at least one limiting amplifier has an input coupled to a limit control signal having a magnitude selected for setting a dynamic range of said at least one limiting amplifier.

14. A mobile phone as set forth in claim 11, wherein said amplified limited frequency modulated RF transmission signal and said received frequency modulated signal are offset from one another by $f_{offset}$ and wherein said intermediate frequency modulated signal has a frequency equal to $f_{offset}$.

15. A mobile phone as set forth in claim 14, wherein $f_{offset}$ is equal to 45 MHz.

16. A method for selectively one of phase modulating or frequency modulating an RF signal, comprising the steps of:

generating one of first quadrature waveshapes or second quadrature waveshapes in response to a modulating signal;

mixing the first quadrature waveshapes or the second quadrature waveshapes with an RF signal to generate a phase modulated RF signal or a frequency modulated signal, respectively; and operating a limiter for reducing an amplitude modulation component of only said frequency modulated signal.

* * * * *